United States Patent
Maejima et al.

(10) Patent No.: US 7,050,346 B2
(45) Date of Patent: May 23, 2006

(54) NON-VOLATILE SEMICONDUCTOR MEMORY DEVICE AND ELECTRIC DEVICE WITH THE SAME

(75) Inventors: Hiroshi Maejima, Chigasaki (JP); Takahiko Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/892,098

(22) Filed: Jul. 16, 2004

(65) Prior Publication Data

US 2005/0036395 A1 Feb. 17, 2005

(30) Foreign Application Priority Data

| Jul. 29, 2003 | (JP) | ............................. 2003-203149 |
| Apr. 15, 2004 | (JP) | ............................. 2004-120725 |
| May 17, 2004 | (JP) | ............................. 2004-146112 |

(51) Int. Cl.
*G11C 7/02* (2006.01)

(52) U.S. Cl. .................. 365/207; 365/205; 365/208; 365/189.01

(58) Field of Classification Search ................ 365/207, 365/205, 208, 189.01
See application file for complete search history.

(56) References Cited

U.S. PATENT DOCUMENTS

| 6,031,760 A * | 2/2000 | Sakui et al. ........... 365/185.21 |
| 6,163,484 A * | 12/2000 | Uekubo .................... 365/185.2 |
| 6,212,109 B1 * | 4/2001 | Proebsting .................. 365/190 |
| 6,504,778 B1 * | 1/2003 | Uekubo ...................... 365/207 |
| 6,771,551 B1 * | 8/2004 | Terzioglu et al. ........... 365/205 |

FOREIGN PATENT DOCUMENTS

JP        11-260076        9/1999

* cited by examiner

*Primary Examiner*—Connie C. Yoha
(74) *Attorney, Agent, or Firm*—Oblon, Spivak, McClelland, Maier & Neustadt, P.C.

(57) ABSTRACT

A non-volatile semiconductor memory device includes a cell array in which electrically rewritable and non-volatile memory cells are arranged, and a sense amplifier circuit configured to read and write data in association with the cell array, wherein the sense amplifier circuit includes: differential amplifier having first and second input nodes and configured to amplify a difference voltage between the first and second input nodes; a data transfer circuit configured to selectively connect the first input node to a bit line in the cell array; a reference voltage setting circuit configured to apply a reference voltage to the second input node of the differential amplifier; and a data storing circuit configured to temporarily hold a loaded write data at the first input node of the differential amplifier, and control the reference voltage at the second input node of the differential amplifier in correspondence with the write data held therein.

18 Claims, 11 Drawing Sheets

NON-VOLATILE SEMICONDUCTOR MEMORY DEVICE AND ELECTRIC DEVICE WITH THE SAME

CROSS-REFERENCE TO RELATED APPLICATION

This application is based on and claims the benefit of priority from the prior Japanese Patent Applications No. 2003-203149, filed on Jul. 29, 2003, and No. 2004-120725, filed on Apr. 15, 2004, the entire contents of which are incorporated herein by reference.

BACKGROUND OF THE INVENTION

1. Field of the Invention

This invention relates to a non-volatile semiconductor memory device and an electric device with the same.

2. Description of Related Art

Currently known EEPROMs are formed to have a type of memory cell which stores charge in a floating gate thereof. A NAND type flash memory, which is known as one of these EEPROMs, has a cell array in which NAND cell units are arranged. Each NAND cell unit is configured to have a plurality of memory cells connected in series. In the NAND cell unit, sources and drains are shared between adjacent memory cells. Therefore, NAND type flash memory has a property that it is easy to increase the memory capacity with a relatively small chip size by increasing the number of cells in the NAND cell unit.

A NAND cell unit is, as described above, configured to have a plurality of memory cells connected in series, and connected to a bit line. A data read operation is done by detecting whether the bit line is discharged or not by a selected cell. Applied to each unselected cell in the NAND cell unit is a pass voltage which is able to turn on it without regard to data held therein. However, due to the fact that plural cells are serially connected in the NAND cell unit, the cannel resistance of the NAND cell unit is large, and cell current is small at the data read time. Conventionally, as a sense amplifier scheme for data determining based on the cell current, a method of judging a voltage difference due to the cell current difference by use of an inverter threshold voltage (refer to, for example, Published and Unexamined Japanese Patent Application (kokai) No. 11-260076).

However, the conventional sense amp scheme for data determining based on the inverter threshold has some problems in viewpoints of lowering the power consumption and increasing the memory capacity in future. As the number of memory cells in a NAND cell unit is increased more, or the power supply voltage becomes lower, the sense margin becomes less. As a result, it becomes difficult to perform a high speed data read operation. Alternatively, there is a fear that data determination becomes impossible.

SUMMARY OF THE INVENTION

According to an aspect of the present invention, there is provided a non-volatile semiconductor memory device including a cell array in which electrically rewritable and non-volatile memory cells are arranged, and a sense amplifier circuit configured to read and write data in association with the cell array, wherein the sense amplifier circuit includes:

a differential amplifier having first and second input nodes and configured to amplify a difference voltage between the first and second input nodes;

a data transfer circuit configured to selectively connect the first input node to a bit line in the cell array;

a reference voltage setting circuit configured to apply a reference voltage to the second input node of the differential amplifier; and a data storing circuit configured to temporarily hold a loaded write data at the first input node of the differential amplifier, and control the reference voltage at the second input node of the differential amplifier in correspondence with the write data held therein.

DETAILED DESCRIPTION OF THE EMBODIMENTS

Illustrative embodiments of this invention will be explained with reference to the accompanying drawings below.

Figure 1:
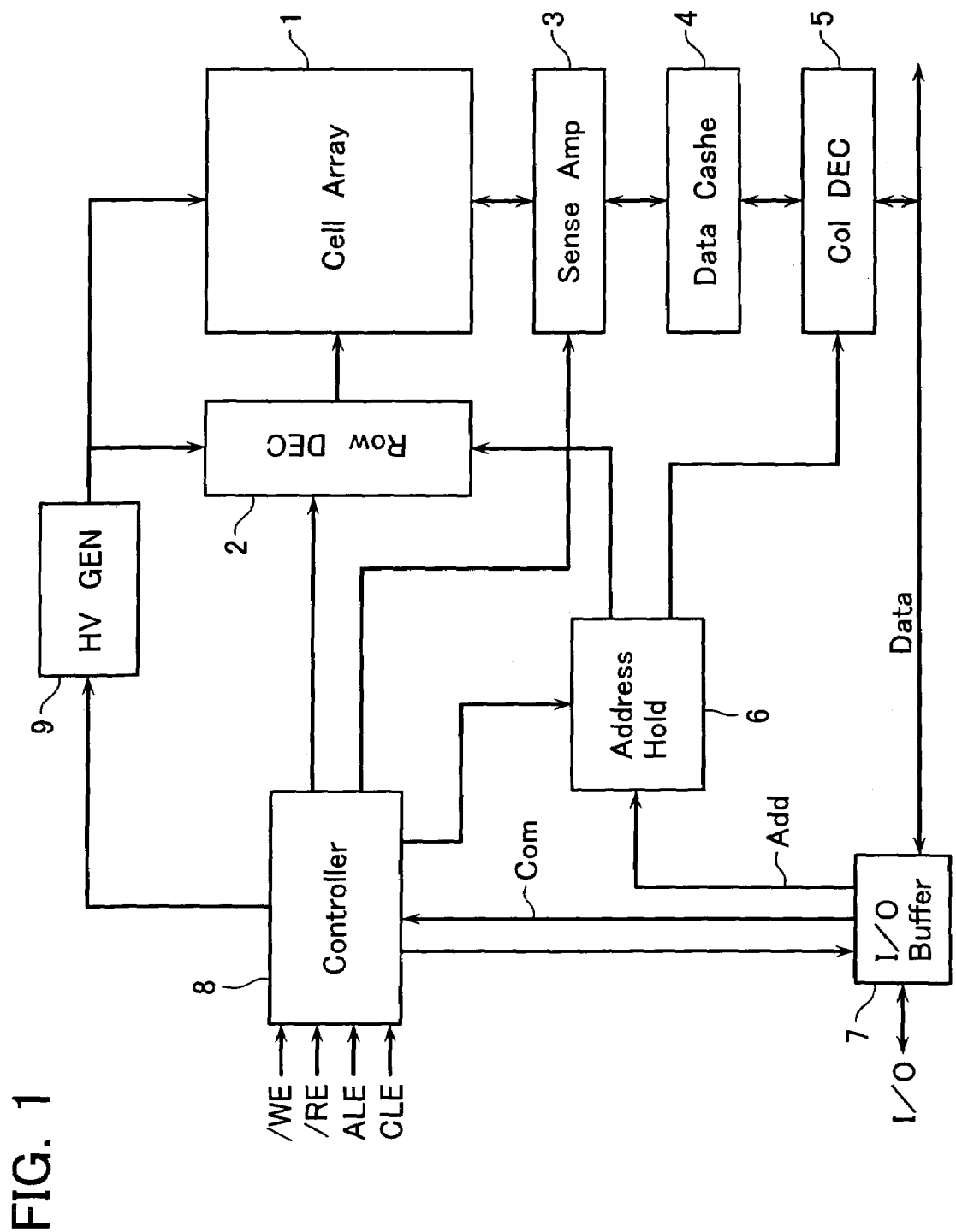
FIG. 1 shows a functional block of a NAND type flash memory in accordance with an embodiment of the present invention.

FIG. 1 shows a circuit architecture of a flash memory according to an embodiment of the present invention. A cell array 1 is, as described later, configured to have a plurality of floating gate type memory cells as being arranged in a matrix manner. A row decoder/word line driver 2 is prepared to select a block and selectively drive word lines and select gate lines of the cell array 1. A sense amplifier circuit 3 serves as a page buffer with sense amplifiers for one page, which is used for bit line data sensing for one page of the cell array 1.

Data cache (data register) 4 is prepared to temporarily hold read data of the sense amplifier 3 for outputting it outside the chip, and temporarily hold write data supplied from external. One page read data are column-selected by a column decoder (column gate) 5 and output to external I/O terminals via I/O buffer 7. Write data supplied from the I/O terminals are selected by the column decoder 5 to be loaded in the data cache 4. Address signals are input to address hold circuit 6 through I/O buffer 7, and row and column addresses are transferred to row decoder 2 and column decoder 5, respectively.

Controller 8 output internal timing signals for read, write and erase operations in response to control signals including write enable signal/WE, read enable signal/RE, address latch enable signal ALE, command latch enable signal CLE and the like. The controller 8 performs sequence controlling of data write and erase operations and data reading based on the internal timing signals. A high voltage generator 9 is controlled by the controller 8 to output various kinds of voltages necessary for data write, erase and read operations.

Figure 2:
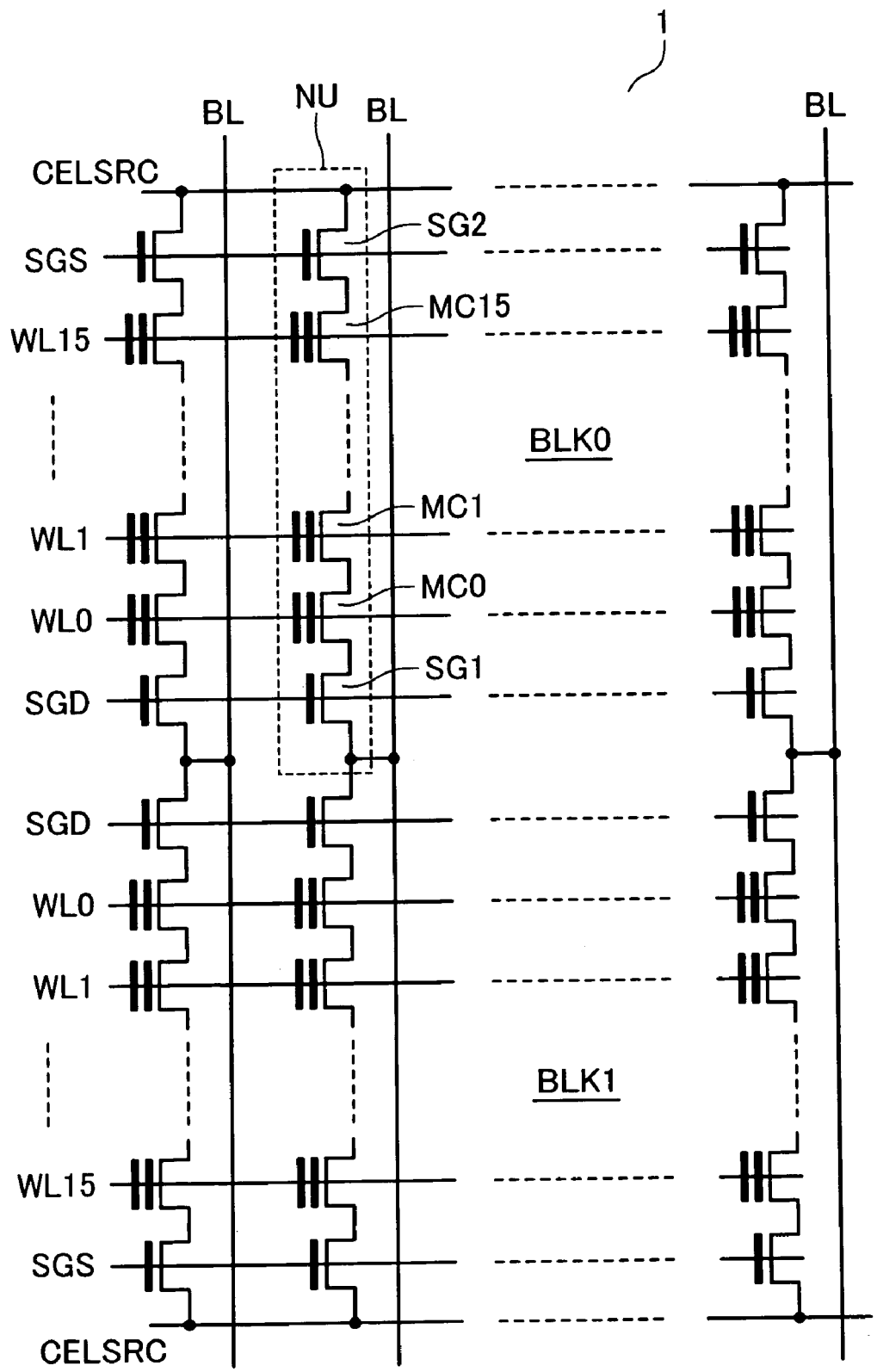
FIG. 2 shows a cell array configuration of the flash memory.

FIG. 2 shows a detailed configuration of the cell array 1. In this example, NAND cell units NU each including plural (sixteen in this example) memory cells MC0–MC15 serially connected are arranged to constitute the cell array 1. One end cell's drain of the NAND cell unit NU is connected to bit line BL though a select gate transistor SG1, and the other end cell's source is connected to source line CELSRC through another select gate transistor SG2.

Control gates of the memory cells MC0–MC15 are connected to word lines WL (WL0–WL15), respectively, and gates of the select transistors SG1 and SG2 are connected to select gate lines SGD and SGS, respectively.

A set of plural memory cells arranged along one word line becomes one page serving as a unit for data reading and data writing at a time. A set of plural NAND cell units arranged in the direction of word lines becomes a block serving as a unit for data erasing at a time. In FIG. 2, a plurality of blocks, BLK0, BLK1, ... are arranged in the direction of the bit lines.

Figure 3:
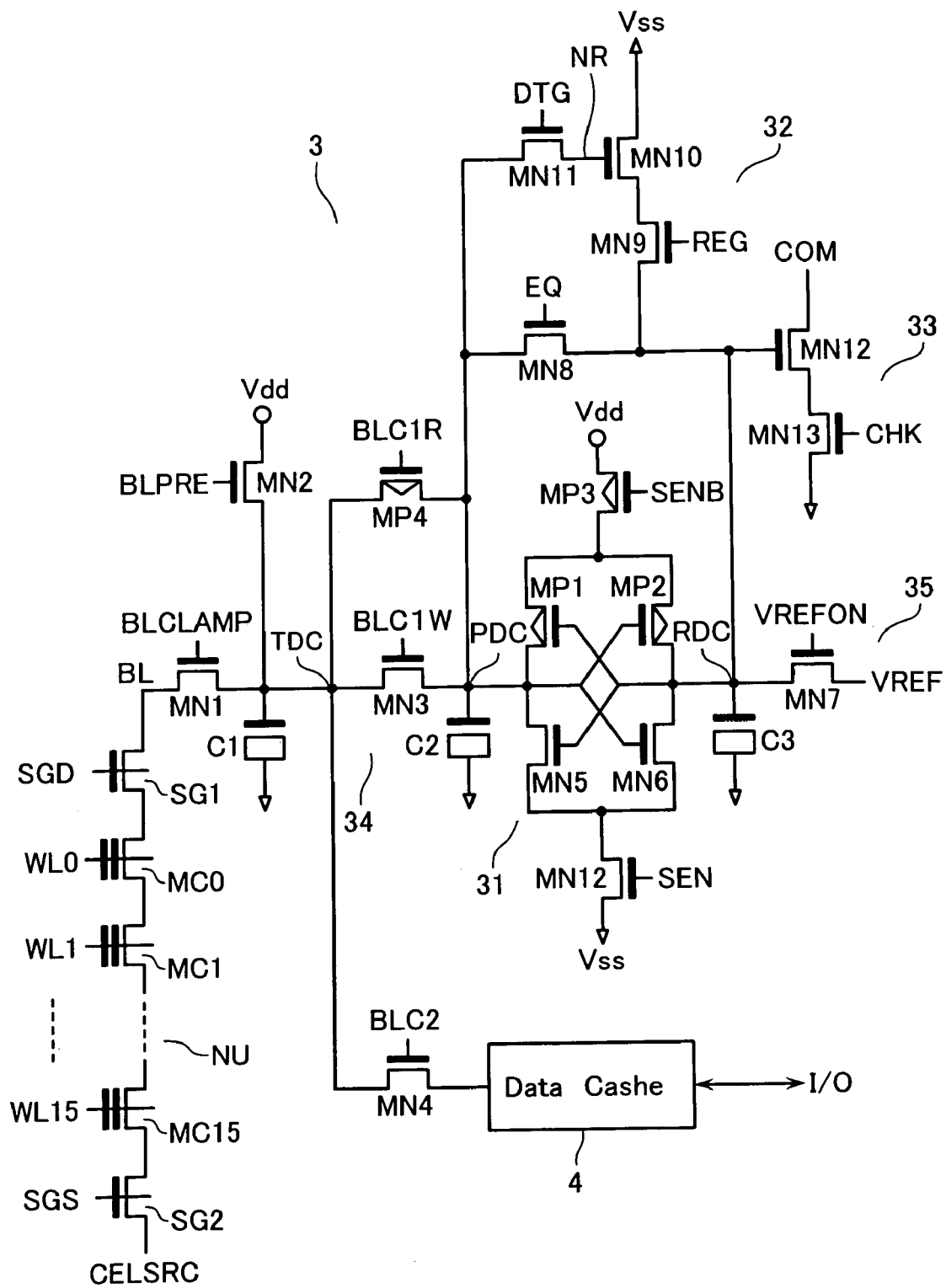
FIG. 3 shows a sense amplifier circuit of the flash memory.

FIG. 3 shows a sense amplifier unit in the sense amplifier circuit 3, which is connected to a bit line. The sense amplifier unit has a differential amplifier 31 which has two CMOS inverters with the respective input/output nodes being cross-coupled. NMOS transistors MN6 and MN7 of the differential amp 31 are connected to ground potential node Vss via an activating NMOS transistor MN12. PMOS transistors MP1 and MP2 of the differential amp 31 are connected to power supply voltage node Vdd via an activating PMOS transistor MP3. Between a first input node (sense-use input node) PDC and a second input node (reference-use input node) RDC of the differential amp 31, an equalizing NMOS transistor MN8 is connected.

The sense-use input node PDC of the differential amp 31 is connected to bit line BL via a data transfer circuit 34. In detail, the input node PDC is connected to a sense node TDC via an NMOS transistor MN3 and a PMOS transistor MP4 as being connected in parallel with each other. The NMOS transistor MN3 serves as a transfer gate in a data write mode, gate of which is driven by a control signal BLC1W. The PMOS transistor MP4 serves as a transfer gate in a data read mode, gate of which is driven by a control signal BLC1R.

The sense node TDC is connected to a bit line BL via a clamping NMOS transistor MN1. This clamping NMOS transistor MN1 serves for clamping the bit line to a predetermined potential in the data read and write modes, and as a pre-sense amplifier for pre-sensing bit line potential in the data read mode. Further connected to the sense node TDC is a prechaging NMOS transistor MN2 for precharging the sense node TDC and bit line BL in the data read and write modes. The sense node TDC is connected to the data cache 4 via a transfer gate NMOS transistor MN4.

To the reference node RDC, an NMOS transistor MN7 constituting a reference voltage setting circuit 35 is connected. That is, a reference voltage VREF which is set as an intermediate value between Vdd and Vss is applied to the reference node RDC via the NMOS transistor MN7 controlled by a control signal VREFON. Further connected to the sense node TDC, input nodes PDC and RDC are capacitors C1, C2 and C3 for holding charge. These capacitors C1, C2 and C3 are formed of MOS capacitors.

Disposed between two input nodes PDC and RDC is a data storing circuit 32 for temporarily holding a write data so as to adjust a reference level of the differential amplifier 31. The data storing circuit 32 has an NMOS transistor MN10 a gate of which serves as a data storing node NR. The source of transistor MN10 is connected to ground potential Vss. Between the sense-use node PDC and the data storing node NR, a transfer NMOS transistor MN11 is disposed for transferring the write data of the sense-use node PDC to the data storing node NR. Further, between the drain of the NMOS transistor MN10 and the reference node RDC, an NMOS transistor MN9 is disposed for setting "H" or "L" level to the reference node RDC based on the data held at the node NR of the NMOS transistor MN10.

Further, connected to the reference node RDC is a gate of an NMOS transistor MN12 whose drain is connected to a common node COM disposed in common for 1-page sense amplifier units. The source of NMOS transistor MN12 is connected to ground potential line Vss via an NMOS transistor MN13. The NMOS transistors MN12 and MN13 constitute a judgment circuit 33 for judging whether 1-page data write has been completed or not. The NMOS transistor MN13 is driven by a control signal CHK to be on in a write-verify mode.

In this embodiment, the sense amplifier circuit 3 basically serves for determining a bit line data transferred to the sense-use input node PDC of the differential amp 31 in comparison with a reference voltage VREF applied to the reference node RDC in normal data read and verify-read after data write. Here, it should be noted that PMOS transistor MP4, whose gate is controlled by the control signal BLC1R="L", is utilized for transferring the bit line data (i.e., bit line voltage change based on a selected cell data) to the differential amplifier 31. A threshold voltage (absolute value) |Vtp| of the PMOS transistor MP4 is predetermined to satisfy the following expression (1) corresponding to the reference voltage VREF, which is an intermediate voltage between "0" write data (="L" level) and "1" write data (="H" level) to be held at the input node PDC.

$$Vss < |Vtp| < VREF \qquad (1)$$

Another feature of the sense amplifier circuit 3 of this embodiment is in a fact that the write data held in the differential amp 31 is transferred to the data storing circuit 32 before data sensing by the differential amp 31 (i.e., before the bit line data transferring to the differential amp 31) in the verify-read operation. In other words, prior to the bit line discharge starting, the write data is transferred to the data storing circuit 32. This is different from the conventional sense amplifier which transfers read data to the data storing circuit after data sensing, thereby succeeding in improvement of data sense speed.

Next, operations of the NAND-type flash memory according to this embodiment will be described.

Data write operation is usually done by one page in a block after erasing the block at a time. The brief is as follows. "L"(=Vss) or "H"(=Vdd) is applied to a bit line in correspondence with write data "0" or "1", then it is transferred to a selected NAND cell channel. These write data is previously supplied to the node PDC of the differential amplifier 31 through the data cache 4.

Next, write voltage Vpgm and pass voltage Vpass are applied to a selected word line and unselected word lines (at least ones which are positioned between the selected word line and bit line), respectively. The pass voltage Vpass is predetermined to turn on the cell regardless of the data. As a result, in a "0" write cell disposed along the selected word line, whose channel has been set at Vss, electrons are injected into the floating gate, whereby the selected cell is written into a high-threshold voltage state ("0" data). In a "1" write cell (write inhibit cell) disposed along the selected word line, whose channel is in a floating state at a precharged level of Vdd−Vt, the channel is boosted by capacitive coupling, whereby electron injection into the floating gate is not occurred. As similar to this, no data write are occurred in the remaining unselected cells.

To effectively boost the channels of unselected cells, a self-boost scheme is employed. In a normal self-boost scheme, 0V is applied to an unselected word line which is disposed on the source line side of the selected word line and adjacent to it. In a local self-boost scheme, 0V is applied to two unselected word lines sandwiching the selected word line. Detail of these boost-schemes is omitted here.

Figure 4:
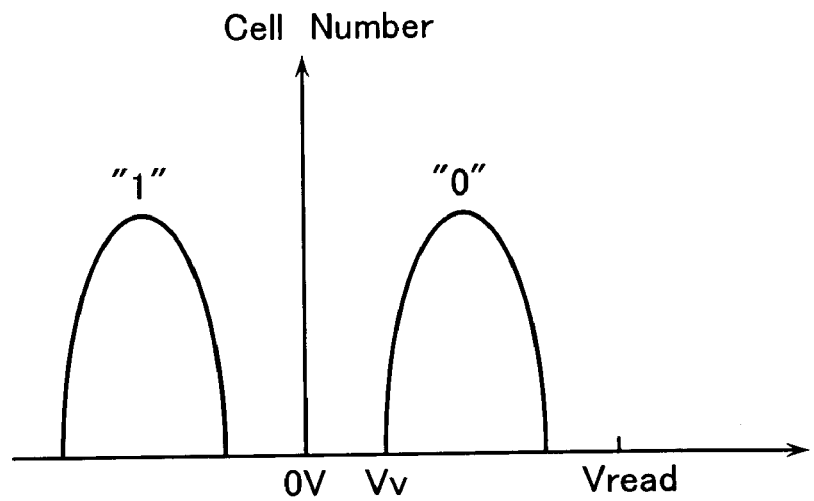
FIG. 4 shows data threshold distributions of the flash memory.

In an ordinary case that binary data are stored in the cell array, the data threshold distribution of the memory cells becomes as shown in FIG. 4. Data "1" (erased state) is a low threshold state (in general, negative threshold state), and data "0" is a high threshold state (in general, positive threshold state). To keep the data distribution in the respective threshold ranges, the data write operation is performed by repeating a write pulse application and a verify-read for verifying the written state.

Figure 5:
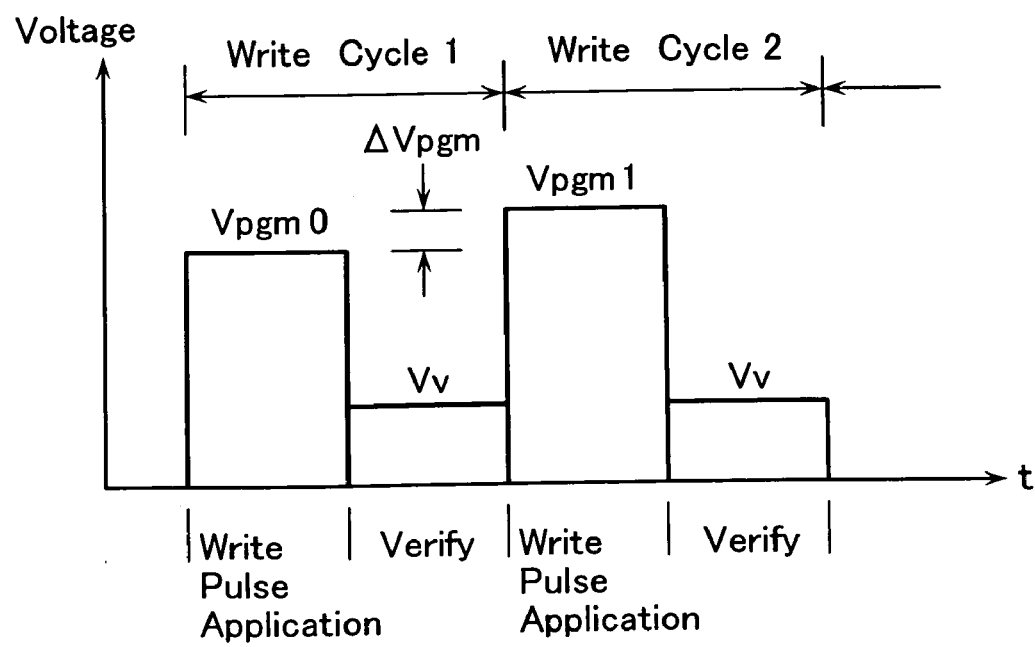
FIG. 5 is a diagram for explanation of a data write operation of the flash memory.

FIG. 5 shows such write cycles. As shown in FIG. 5, write cycles, each of which includes a write pulse voltage (Vpgm) application operation and a verify-read operation for verifying written data by applying a verify voltage Vv, are repeated until when data write for 1-page is completed. The write pulse voltage Vpgm is usually increased by ΔVpgm for each write cycle. The verify voltage Vv, which is a threshold for determining "0" data as shown in FIG. 4, is applied to a selected word line as a read voltage.

In a normal data read, discrimination between "0" and "1" thresholds as shown in FIG. 4 is performed. To do this, 0V and pass voltage Vread are applied to a selected word line and unselected word lines, respectively, and it is detected whether the bit line is discharged or not. The pass voltage Vread is selected to turn on the unselected cells without regard to the data. In the write-verify read, except that verify voltage Vv is applied to the selected word line for determining whether "0" data is written or not, the same operation condition is used as the normal data read.

As described above, where "1" data write is done in the data write operation, a "H" level data is applied to the bit line, and "1" write data is sensed as a "L" level data in the verify-read. That is, "1" write data is inverted in logic in the verify-read. Therefore, to repeat the write cycle, it is required to hold the write data, and write back a data level necessary for "1" data write in the following cycle. In the conventional sense amplifier circuit, it takes a data write back time for write-verify reading after data sensing, thereby preventing high-speed data sensing.

On the contrary, in the sense amplifier circuit 3 according to this embodiment, the write data is transferred to and stored in the data storing circuit 32 in the write-verify read operation prior to data sensing rather than after data sensing, moreover it is made possible to control the reference level of the reference node RDC of the differential amp 31. With such a function, the operation of the sense amplifier circuit 3 will be described in detail bellow.

Figure 6:
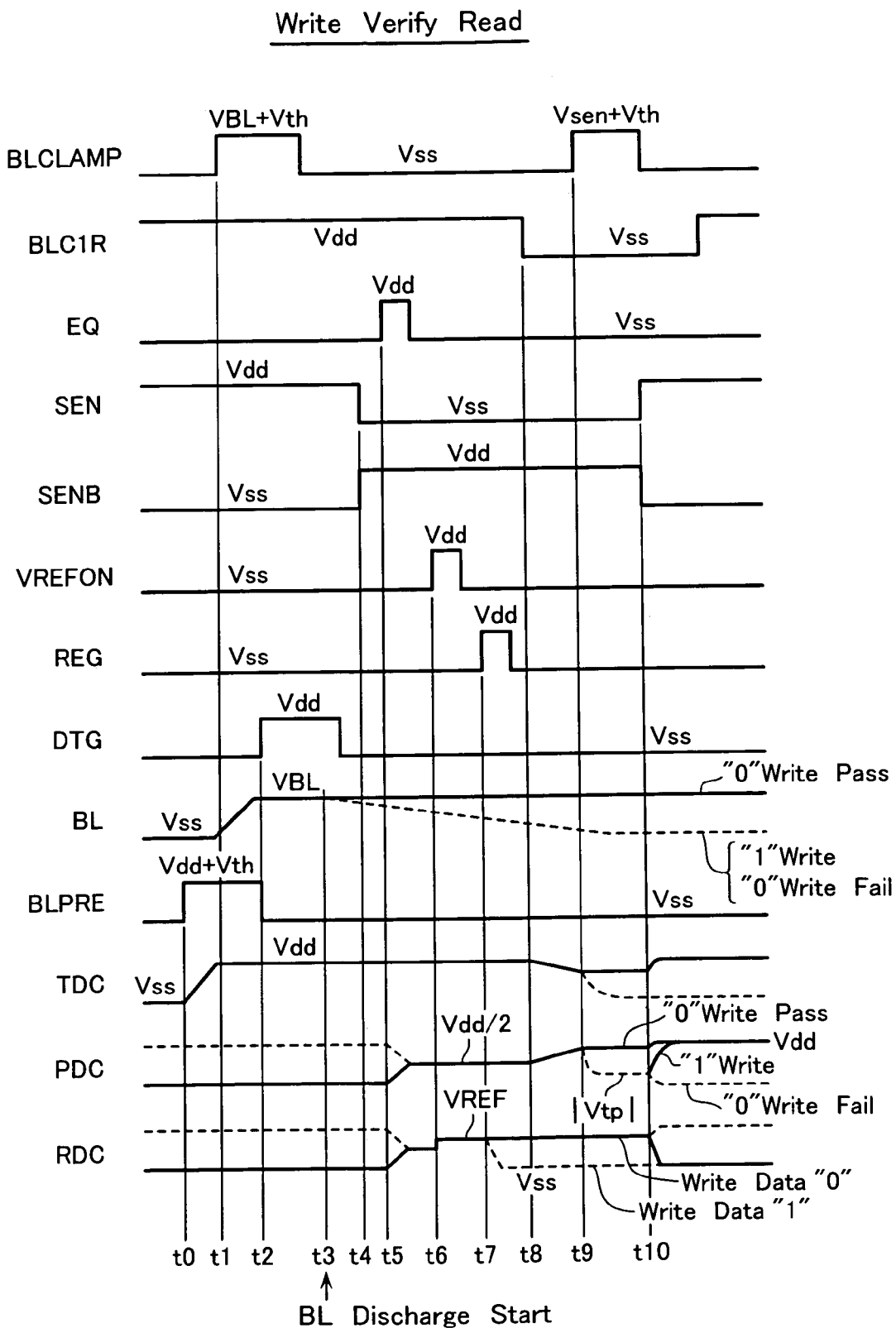
FIG. 6 is a timing diagram for explanation of write verify-read operation of the flash memory.

FIG. 6 shows a timing chart of the verify-read operation after data writing. Prior to this verify-read operation starting, "L" or "H" is applied to the input node PDC of the differential amp 31 in correspondence with data "0" or "1" as described above, and then data write operation is done. Note here that "H" serving as "1" write data may be a resultant one in case "0" write data has been judged as "Pass" by the verify-read in the last write cycle.

As a "H" level equal to or higher than Vdd+Vth (Vth is a threshold voltage of NMOS transistor) is applied to the control node BLPRE at timing t0, NMOS transistor MN2 becomes on, thereby precharging the sense node TDC at Vdd. Sequentially, apply voltage VBL+Vth to the control node BLCLAMP at timing t1, and the bit line BL is precharged to VBL (<Vdd) via NMOS transistor MN1 turned on.

At timing t2, as control node BLPRE becomes "L", the bit line precharging operation is stopped, and thereafter control node TDG becomes "H". As a result, the write data held at the node PDC is transferred to the node NR of the data storing circuit 32 via NMOS transistor MN11. At timing t4 after the clamping NMOS transistor MN1 turning off in response to BLCLAMP="L", the select gate line SGD becomes "H" in the selected block, whereby discharge of the bit line BL is started. As described above, before the bit line discharge starting, the write data held in the differential amplifier 31 is transferred to the data storing circuit 32.

In the verify-read time, verify voltage Vv is applied to the selected cell as described above, whereby cell current will be carried in correspondence with the cell data. In detail, a selected cell, into which data "0" has been written, becomes off, thereby causing the bit line to be not discharged (as shown by a solid line). Another selected cell, into which data "1" has been written (in detail, write data is "1" or, "0" write is not sufficient) becomes on, thereby causing the bit line to be discharged (as shown by a dot line).

So far, the differential amplifier 31 is held at an active state. At timing t4, sense amp activating signals SEN and SENB becomes "L"(=Vss) and "H"(=Vdd), respectively, to disable the differential amplifier 31. Successively, at timing t5, the equalizing signal EQ becomes "H", whereby nodes PDC and RDC of the differential amp 31 are equalized to be Vdd/2. Then, in response to VREFON="H" at timing t6, the reference voltage VREF is applied to the reference node RDC via NMOS transistor MN7.

Next, at timing t7, as an "H" level signal is applied to a control node REG, the reference voltage at the reference node RDC of the differential amp 31 is controlled in response to the data held in the data storing circuit 32. In detail, in case the data storing node NR is "L" (i.e., write data is "0"), NMOS transistor MN10 is off, and the reference node RDC is held at the reference voltage VREF as having been precharged. In case the data storing node NR is "H" (i.e., write data is "1"), NMOS transistor MN10 is on, whereby "L" level(=Vss) at the source of NMOS transistor MN10 is applied to the reference node RDC via NMOS transistor MN9.

After having set the reference node RDC to be VREF or Vss in correspondence with the write data, at timing t8, an "L" level signal is applied to the control node BLC1R to turn on the transfer PMOS transistor MP4, whereby the node PDC of the differential amp 31 is communicated with the sense node TDC. These nodes PDC, TDC are slightly shifted in voltage level due to charge-sharing therebetween. A moment later, at timing t9, a sense-use voltage of Vsen+Vth (Vsen<VBL) is applied to the control node BLCLAMP. Vsen is selected to turn on NMOS transistor MN1 in case that bit line BL has been discharged to be a sufficiently low voltage.

As a result, the sense-use input node PDC is forced to be changed in level in response to the bit line voltage (i.e., cell data). In detail, in case write data "0" has been sufficiently written into the selected cell, NMOS transistor MN1 is held off, and the nodes TDC and PDC are held at a high level. If write data is "1" or write data "0" is not sufficiently written (i.e., "0" write is "Fail" because of that the threshold increasing is not sufficient), NMOS transistor MN1 becomes on, whereby the node TDC and PDC are discharged via NMOS transistor MN1 to be brought near to the "L" level of bit line BL. Note here that "L" level of the node PDC is limited by the threshold voltage of PMOS transistor MP4 to be |Vtp|.

Activating the differential amp 31 at timing t10, the difference voltage between the nodes PDC and RDC is amplified to result in that one of PDC and RDC is Vdd, and the other Vss. In detail, if "0" write is "Pass", the sense-use input node PDC is higher in level than the reference voltage VREF has been set at the reference node RDC, whereby the node PDC is amplified to Vdd. If "1" write is done, the sense-use input node PDC is at a low level (=|Vtp|), while the reference node RDC has been set at Vss, whereby the node PDC is inverted in level to become "H" of Vdd. If "0" write is "Fail", the sense-use input node PDC is at a low level (=|Vtp|), while the reference node RDC has been set at VREF, whereby the node PDC is decided to be at an "L" level of Vss.

As described above, in case "0" write has been sufficiently done or "1" write has been done, the sense-use input node PDC becomes "H", whereas unless "0" write has been sufficiently done, the node PDC becomes "L". As the "H", "L" data of the node PDC serves as the write data in the following write cycle, the write cycle is repeated in the same way until all write data of 1-page are completely written.

The data sense result in each write cycle is checked by applying a check signal CHK="H" at the end of each cycle. In detail, if the entire 1-page write data are "Pass", all of the reference nodes RDC become "L", whereby the common node COM is not discharged and held at an "H" level when CHK becomes "H". If at least one bit in "0" write data is insufficiently written, the common node COM becomes "L".

Figure 7:
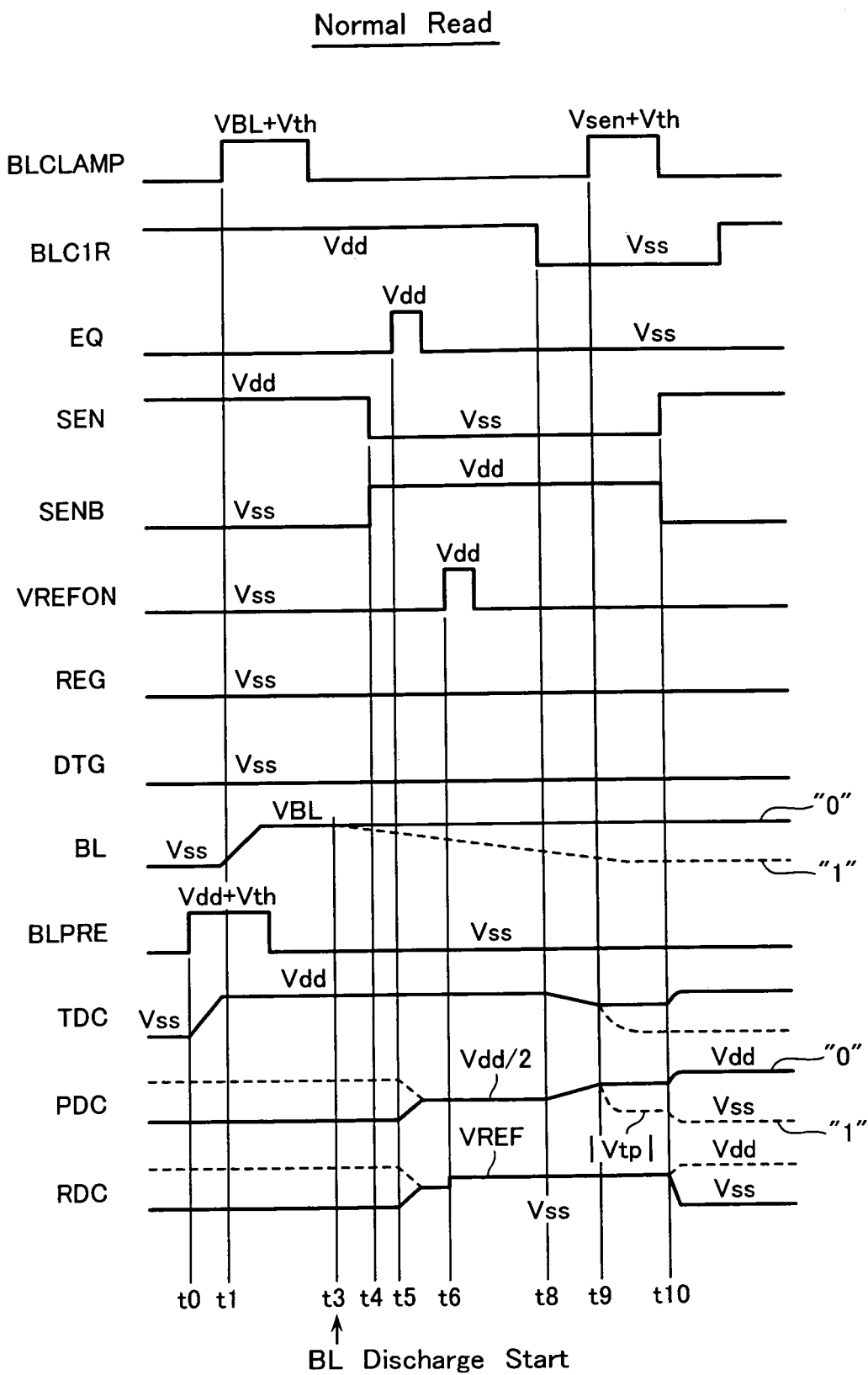
FIG. 7 is a timing diagram for explanation of an ordinary read the flash memory.

FIG. 7 shows a timing chart of a normal data read operation in comparison with that of FIG. 6. In the normal data read operation, it is not required to transfer write data to the data storing circuit 32 so as to set the reference node level of the differential amp 31 in correspondence with the write data. Therefore, during the data read operation, the control signals DTG and REG are held at an "L" level. Except this point, the operation timings are the same as those of the verify-read operation shown in FIG. 6.

As described above, according to this embodiment, by use of a differential amplifier in the sense amplifier circuit, high sensitivity may be achieved, thereby improving the data read speed. In addition, the sense amplifier circuit according to this embodiment is different from the conventional one in the following point: before bit line discharge staring in the data read mode, write data held in the differential amp is transferred to the data storing circuit; and the reference voltage of the differential amp is controlled by the write data prior to data sensing. Therefore, in comparison with the conventional sense amplifier in which data write back is done after data sensing, a high-speed data read operation may be performed because it is not necessary to take a long time in vain. Furthermore, employing a PMOS transistor serving as a transfer gate for transferring bit line data to the differential amplifier, it is possible to sense only a case that "0" write is insufficient as an "L" level data. Therefore, sensed data may be used as write data as it is in the following write cycle.

Figure 8:
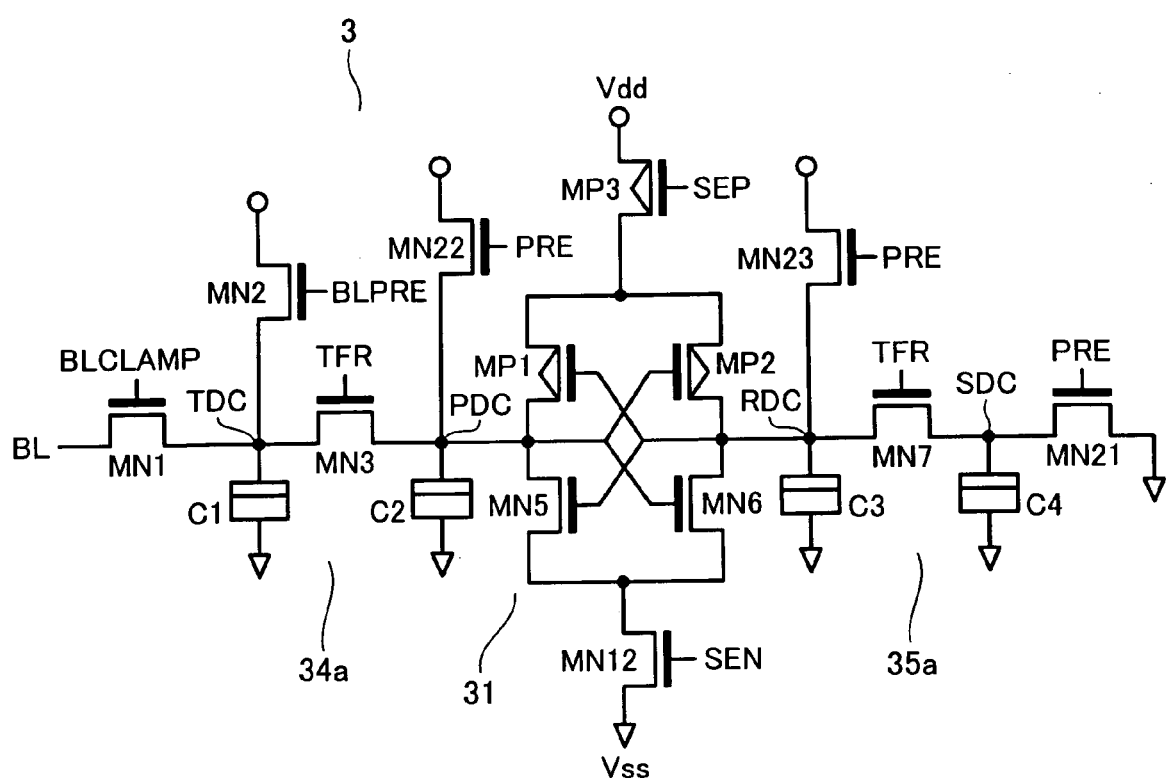
FIG. 8 shows a sense amplifier circuit of a flash memory in accordance with another embodiment.

FIG. 8 shows a sense unit of the sense amplifier circuit 3 used in a NAND flash memory in accordance with another embodiment. Flash memory configuration and cell array configuration thereof in this embodiment are the same as those shown in FIGS. 1 and 2. In the sense amplifier circuit 3 shown in FIG. 8, the same reference symbols are used for the circuit portions corresponding to those in the sense amplifier shown in FIG. 3. It should be noted that circuit portions such as data storing circuit and the like used for write-verify judging are omitted in FIG. 8, and only circuit portions necessary for data reading are shown.

The sense amplifier circuit 3 shown in FIG. 8 has the same differential amplifier 31 as in FIG. 3. In addition to the bit line precharging NMOS transistor MN2 connected to the sense node TDC, a precharging NMOS transistor MN22 is connected to one input node (sense-use input node) PDC of the differential amplifier 31, gate of which is driven by a control signal PRE. Corresponding to this, a precharging NMOS transistor MN23 with a gate driven by the control signal PRE is connected to the other input node (first reference node) PDC of the differential amplifier 31.

The sense-use input node PDC is connected to a bit line via a data transfer circuit 34a. In detail, the input node PDC is connected to the sense node TDC via a transfer NMOS transistor MN3. The sense node TDC is connected to a bit line BL via NMOS transistor MN1 serving for bit line voltage clamping and serving as a pre-sense amplifier. As similar to FIG. 3, precharging NMOS transistor MN2 is connected to the sense node TDC, and charge-storing capacitors C1 and C2 are connected to the nodes TDC and PDC.

The first reference node RDC is connected to a second reference node SDC via an equalizing NMOS transistor MN7, and the second reference node SDC is connected to ground potential node Vss via a precharging NMOS transistor MN21 with a gate driven by the control signal PRE. Charge-storing capacitors C3 and C4 are connected to the first and second reference nodes RDC and SDC, respectively. Capacitors C1 to C4 are formed of MOS capacitors as similar to those in the above-described embodiment.

The circuit portions including transistors MN7 and MN21 serially connected to the first reference node RDC, and the capacitor C4 connected to the second reference node SDC, which is an interconnection node between the transistors MN7 and MN21, constitute a reference voltage setting circuit 35a together with the capacitor C4 and transistor MN23, which serves for setting a reference voltage at the first reference node RDC.

This reference voltage setting circuit 35a is, as described later, for generating a certain reference voltage at the reference node RDC, which serves for determining the bit line data transferred to the input node PDC, based on a precharging operation for precharging the nodes RDC and SDC to different voltages, and a charge-sharing operation between the capacitors C3 and C4.

Figure 9:
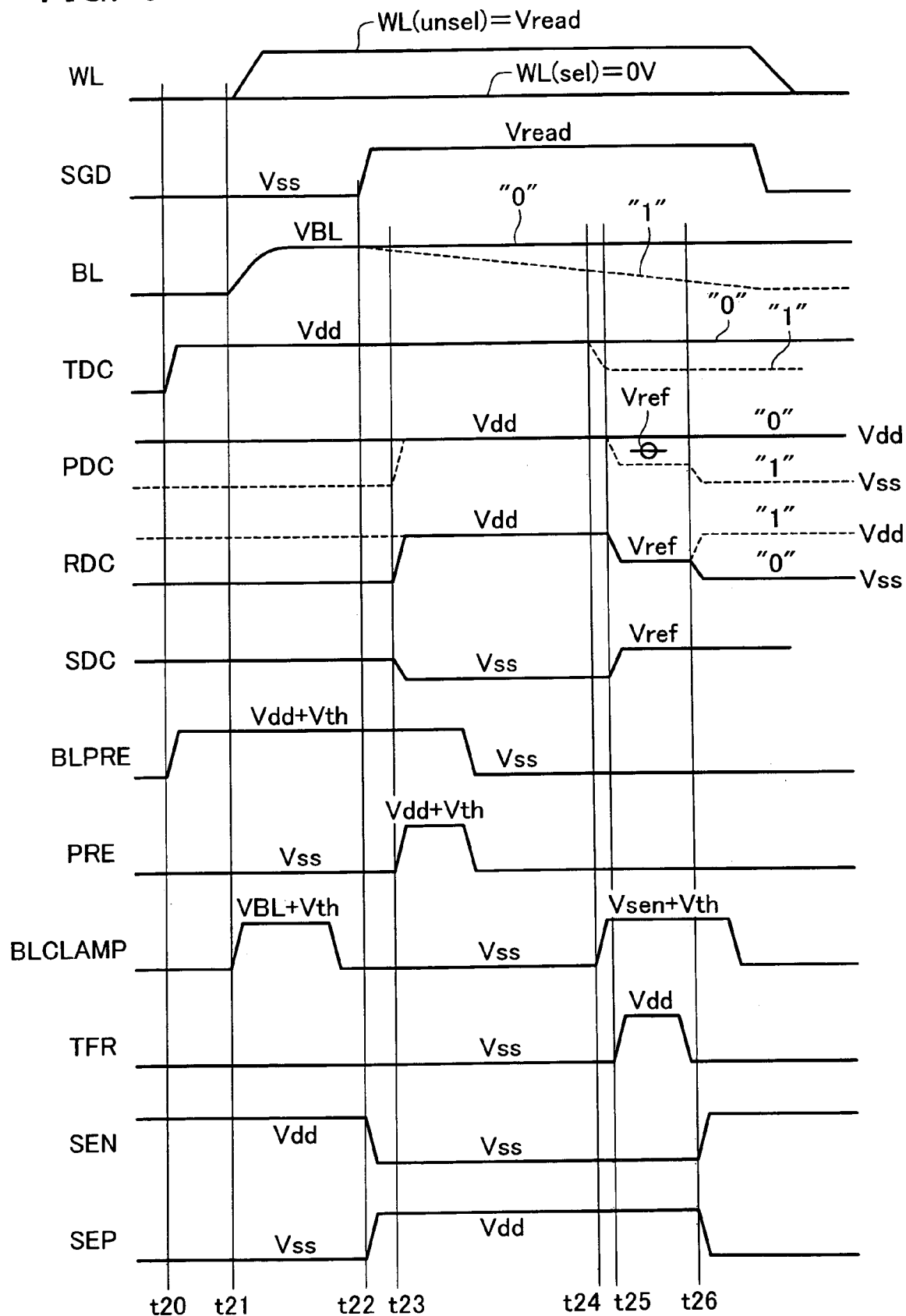
FIG. 9 is a timing diagram for explanation of an ordinary read operation of the flash memory.

Referring to FIG. 9, a data read operation with this sense amplifier circuit 3 shown in FIG. 8 in accordance with this embodiment will be explained below. Apply an "H" level voltage equal to or higher than Vdd+Vth (where, Vth is the threshold voltage of NMOS transistors) to the gate node BLPRE at timing t20, and NMOS transistor MN3 turns on to precharge the sense node TDC at Vdd. Successively, as VBL+Vth is applied to the gate node BLCLAMP at timing t21, the bit line BL is precharged at VBL via turned-on NMOS transistor MN1. This precharge voltage VBL of the bit line BL is selected as being lower than the power supply voltage Vdd. Simultaneously with the bit line precharge, 0V is applied to a selected word line WL(sel) in a selected block, and pass voltage Vread to the remaining word lines WL(unsel) and select gate line SGS. The select gate line SGD at bit line side is held at "L" level(=Vss) during the bit line precharge operation.

After having finished the bit line precharge operation by turning off the clamping transistor MN1, let the sense amp activation signals SEN and SEP be "L"(=Vss) and "H" (=Vdd), respectively, at timing t22, and the differential amplifier 31 is disabled. So far, one of the nodes PDC and RDC is held at "H", and the other at "L" in response to the read data in the last read cycle. Simultaneously, apply an "H" level (for example, pass voltage Vread) to the select gate line SGD, and the bit line discharge operation starts in communication with a NAND cell unit including a selected cell. In detail, in case the selected cell is off (i.e., data "0"), the bit line BL is not discharged as sown by a solid line, while in case the selected cell is on (i.e., data "1"), the bit line BL is discharged by the selected cell to be decreased in level as shown by a dotted line.

Thereafter, apply Vdd+Vth to the gate nodes PRE to turn on the precharging transistors MN21, MN22 and MN23 at timing t23. As a result, the sense-use input node PDC and first reference node RDC are precharged at the power voltage Vdd, while the second reference node SDC is precharged at the ground potential Vss.

Letting the gate nodes BLPRE, PRE be "L", the precharge operation of the nodes PDC, RDC, TDC and SDC is ended. With a certain delay time, apply sense-use voltage Vsen+Vth to the gate node BLCLAMP of the clamping transistor MN1 at timing t24. Here, Vsen is set to be slightly lower than the bit line precharge voltage VBL that is applied at timing t21.

At this time, if the selected cell's data is "0", NMOS transistor MN1 is off, whereby the sense node TDC is held at the precharged voltage Vdd. In case that the selected cell's data is "1", NMOS transistor MN1 becomes on, whereby the sense node TDC is decreased in voltage to about the bit line voltage.

In a moment after timing t24 (alternatively, at the same time), apply an "H" level to the gate nodes TFR to turn on NMOS transistors MN3 and MN7 at timing t25, and the nodes PDC and TDC are shorted-circuit at the input node PDC side of the differential amplifier 31. In case cell data is "1", the nodes PDC, TDC are held at the precharged voltage Vdd, while in case data is "0", the node PDC is decreased in voltage due to charge-sharing between a capacitance of the node PDC and a capacitance of the node TDC and bit line BL. Supposing that the bit line capacitance is sufficiently larger than that of capacitors C1 and C2, the voltage of node PDC is reduced to be substantially the same as the bit line voltage at this time. As a result, the bit line voltage has been amplified by the NMOS transistor MN1 to be transferred to the node PDC.

In contrast to this, at the reference node RDC side of the differential amplifier 31, the equalizing NMOS transistor MN7 becomes on together with the NMOS transistor MN3, thereby causing for charge-sharing between the nodes RDC and SDC, which have been precharged at Vdd and Vss respectively and are held in a floating state. Thus, the nodes RDC and SDC are equalized to be set at a reference voltage. In detail, supposing that the capacitances of the capacitors C3 and C4 are expressed as C3 and C4, respectively, the reference voltage Vref generated at the nodes RDC and SDC is expressed by the following expression (2).

$$Vref = Vdd \cdot C3/(C3+C4) \qquad (2)$$

This reference voltage Vref is set to be higher than the bit line voltage at timing t24 in case of data "1", and more especially is set to be between the "H" and "L" levels at the input node PDC after timing t25. Then after having turned off the NMOS transistors MN3 and MN7, apply SEN="H"

and SEP="L" to the differential amplifier 31 to activate it at timing t26. As a result, in case that the cell data is "0", the nodes PDC and RDC are amplified to Vdd and Vss, respectively, while in case that the cell data is "1", the nodes PDC and RDC are amplified to Vss and Vdd, respectively.

Using the above-described sense amplifier scheme in accordance with this embodiment, it is possible to perform high-speed data sense in comparison with the conventional sense amplifier scheme by suitably setting the reference voltage Vref expressed by the expression (2). In detail, it is required of the conventional sense amplifier scheme to make data sense pending until the bit line voltage difference between cell data "0" and "1" becomes sufficiently large after bit line discharge starting (timing t22). Especially, the more the number of cell in a NAND cell unit, or the lower the power supply voltage, the more gentle the bit line discharge waveform, whereby it will take a long time for data sensing.

By contrast with this, setting the above-described reference voltage Vref at an appropriate value in this embodiment, it becomes possible to do data sense at an early timing after bit line discharge starting. Supposing that, for example, the capacitances C3 and C4 are set as C3=2×C4, the reference voltage Vref becomes as Vref=(⅔)Vdd. In this case, if the bit line voltage in case cell data is "1" is decreased to be lower than (⅔)Vdd at timing t24, it is able to distinguish between the cell data "0" and "1". In other words, it is possible to shorten the waiting time defined as a period from timing t22 to timing t24 shown in FIG. 9.

As an embodiment, an electric card using the non-volatile semiconductor memory devices according to the above-described embodiment of the present invention and an electric device using the card will be described bellow.

Figure 10:
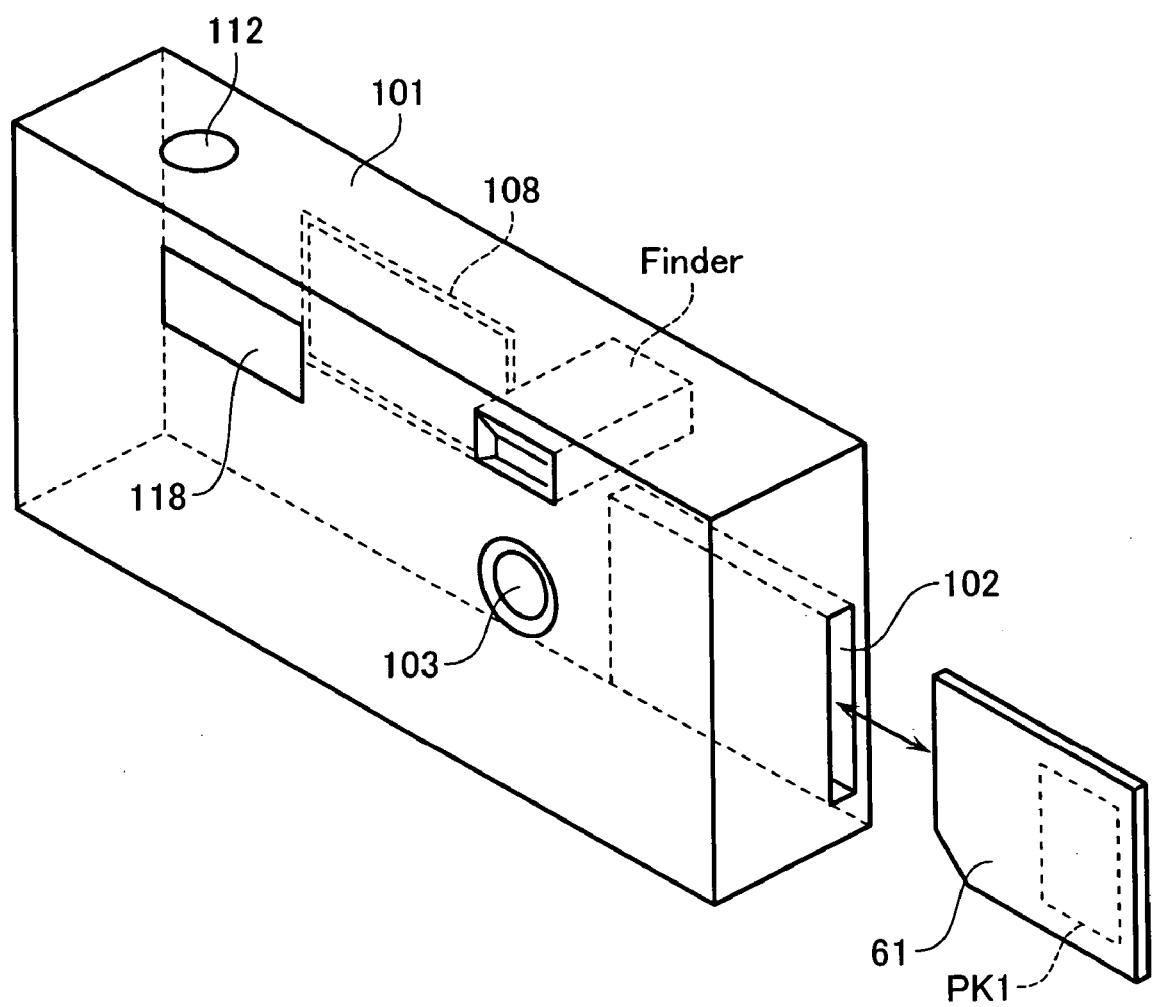
FIG. 10 shows an embodiment applied to a digital still camera.

FIG. 10 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 11:
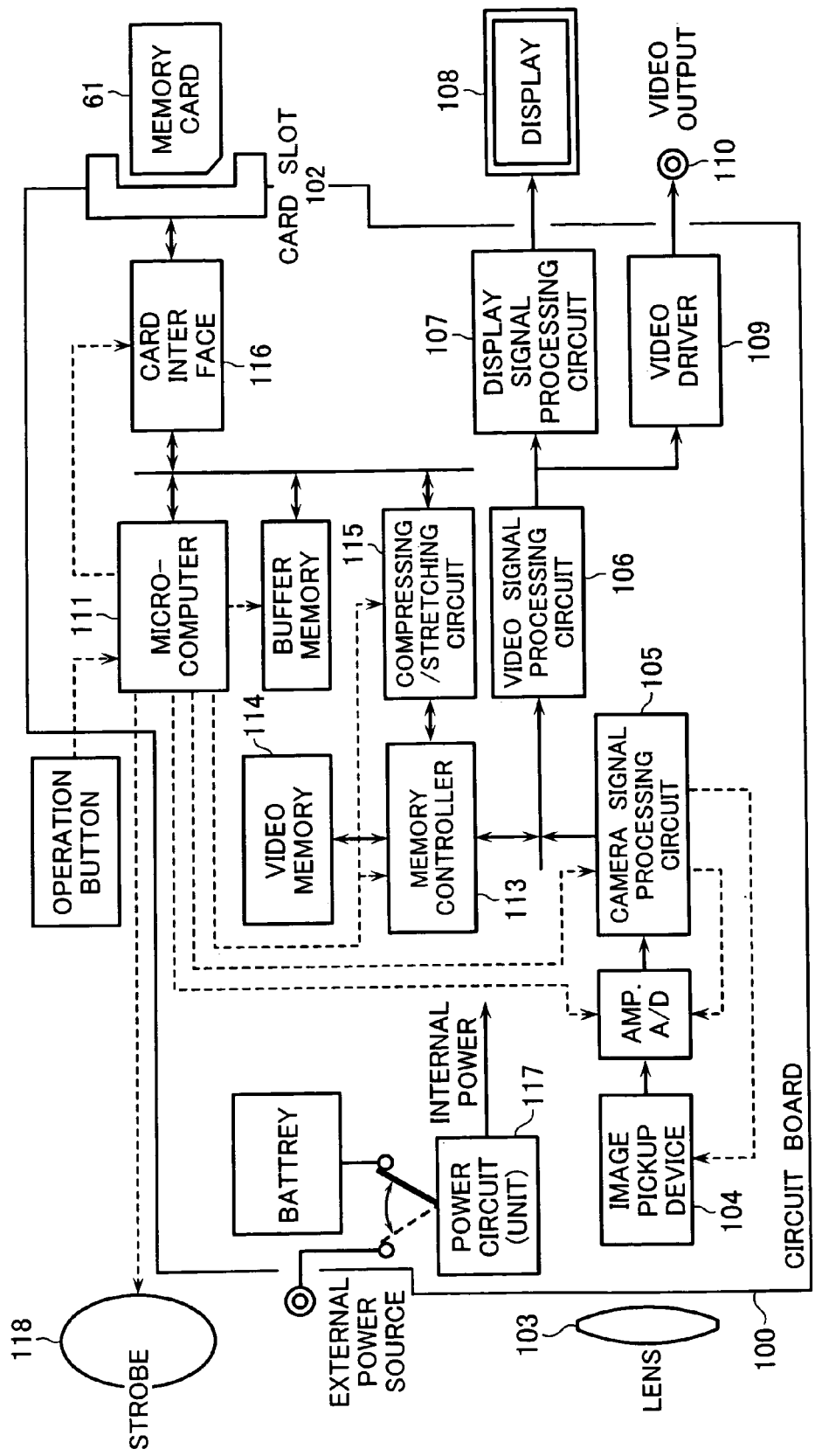
FIG. 11 shows an internal configuration of the digital still camera.

FIG. 11 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 12A to 12J, as well as in portable electric devices.

Figure 12A:
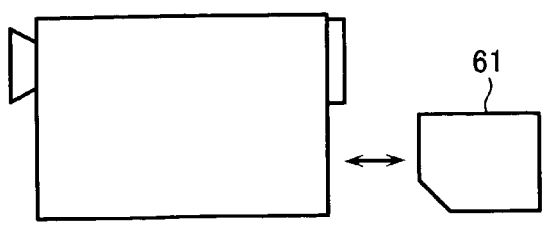
FIGS. 12A to 12J show other electric devices to which the embodiment is applied.
Figure 12F:
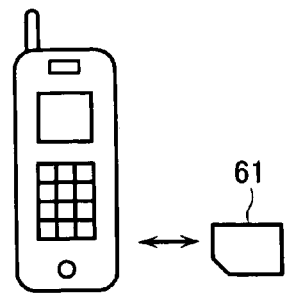
Figure 12B:
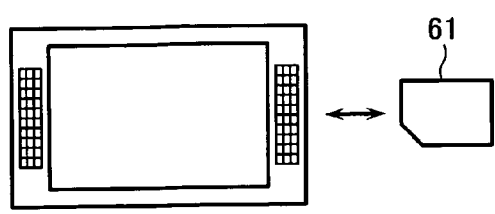
Figure 12G:
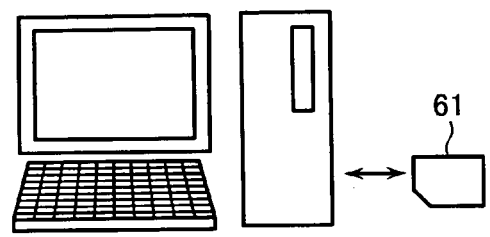
Figure 12C:
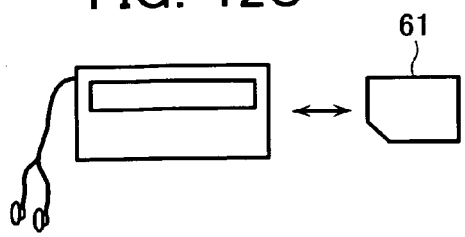
Figure 12H:
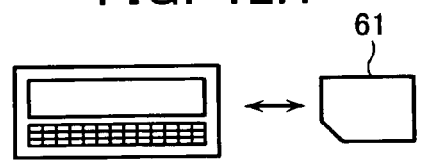
Figure 12D:
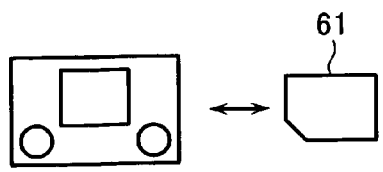
Figure 12I:
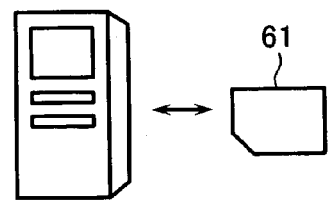
Figure 12E:
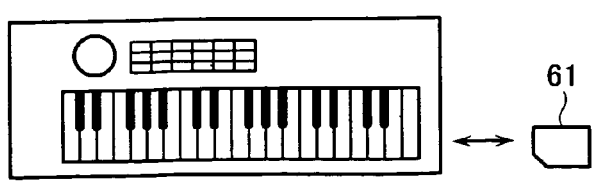
Figure 12J:
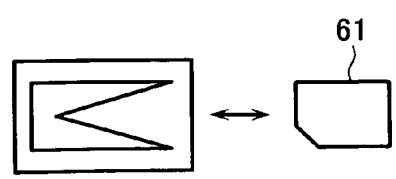

That is, the electric card can also be used in a video camera shown in FIG. 12A, a television set shown in FIG. 12B, an audio apparatus shown in FIG. 12C, a game apparatus shown in FIG. 12D, an electric musical instrument shown in FIG. 12E, a cell phone shown in FIG. 12F, a personal computer shown in FIG. 12G, a personal digital assistant (PDA) shown in FIG. 12H, a voice recorder shown in FIG. 12I, and a PC card shown in FIG. 12J.

The aforementioned embodiments are merely examples and hence do not restrict the present invention. Although a NAND-type flash memory device is explained in the above-described embodiments, the present invention is applicable to other non-volatile semiconductor memory devices of, for example, NOR-type, DINOR-type, and the like. Further, it will be understood by those skilled in the art that various changes in form and detail may be made without departing from the spirit, scope, and teaching of the invention.

What is claimed is:

1. A non-volatile semiconductor memory device comprising a cell array in which electrically rewritable and non-volatile memory cells are arranged, and a sense amplifier circuit configured to read and write data in association with said cell array, wherein
said sense amplifier circuit comprises:
a differential amplifier having first and second input nodes and configured to amplify a difference voltage between said first and second input nodes;
a data transfer circuit configured to selectively connect said first input node to a bit line of said cell array;
a reference voltage setting circuit configured to apply a reference voltage to said second input node of said differential amplifier; and
a data storing circuit configured to temporarily hold a loaded write data at said first input node of said differential amplifier, and control the reference voltage at said second input node of said differential amplifier in correspondence with the write data held therein before bit line data is transferred to said differential amplifier in a data write cycle.

2. The non-volatile semiconductor memory device according to claim 1, wherein
said data transfer circuit comprises:
a clamping transistor disposed between a bit line of said cell array and a sense node for clamping a bit line voltage and serving as a pre-sense amplifier;
a precharging transistor connected to said sense node for precharging said sense node and bit line;
a transfer NMOS transistor disposed between said sense node and said first input node of said differential amplifier, and selectively driven to turn on in a data write mode; and
a transfer PMOS transistor disposed between said sense node and said first input node of said differential amplifier, and selectively driven to turn on in a data read mode.

3. The non-volatile semiconductor memory device according to claim 1, wherein
in a verify-read operation in a data write cycle, the write data held at said first input node of said differential amplifier is transferred to said data storing circuit before bit line data is transferred to said differential amplifier.

4. The non-volatile semiconductor memory device according to claim 1, wherein in a verify-read operation in a data write cycle, said differential amplifier is disabled after said write data held at said first input node has been transferred to said data storing circuit and before bit line data is transferred to said differential amplifier, and then the reference voltage is set at said second input node by said reference voltage setting circuit, successively the reference voltage of said second node is adjusted based on the write data held in said data storing circuit.

5. The non-volatile semiconductor memory device according to claim 4, wherein
the write data held at said first input node of said differential amplifier is a "L" level of "0" data or a "H" level of "1" data, and wherein
the reference voltage initially applied to said second input node of said differential amplifier is VREF as being an intermediate value between the "H" and "L" levels, and wherein
said data storing circuit controls said second input node in such a manner that the reference voltage VREF is maintained in case the write data is "0", while it is reduced to ground potential Vss from VREF in case the write data is "1".

6. The non-volatile semiconductor memory device according to claim 4, wherein
the threshold voltage Vtp of said transfer PMOS transistor and the reference voltage VREF are selected as satisfying a relationship of Vss<|Vtp|<VREF, and wherein
said differential amplifier is activated in a verify-read operation after data writing to operate in such a manner that said first input node changes to have a "H" level in case write data "0" is sufficiently written or write data is "1", while said first input node changes to have a "L" level in case write data "0" is insufficiently written.

7. The non-volatile semiconductor memory device according to claim 5, wherein
said data storing circuit comprises:
a first NMOS transistor with a gate serving as a data storing node and a source to which ground potential Vss is applied;
a second NMOS transistor, whose gate is driven by a first timing signal, disposed between said first input node of said differential amplifier and the gate of said first NMOS transistor for transferring the write data held at said first input node to the gate of said first NMOS transistor; and
a third NMOS transistor, whose gate is driven by a second timing signal, disposed between a drain of said first NMOS transistor and said second input node of said differential amplifier for transferring ground potential Vss to said second input node of said differential amplifier in case write data is "1".

8. The non-volatile semiconductor memory device according to claim 1, further comprising a judgment circuit configured to monitor the level of said second input node of said differential amplifier, and judge a data write completion in a data write cycle.

9. The non-volatile semiconductor memory device according to claim 1, wherein
said cell array comprises a plurality of NAND cell units each having plural memory cells connected in series, control gates of which are connected to different word lines respectively, one end of each NAND cell unit being connected to a bit line via a first select transistor, the other end to a source line via a second select transistor.

10. An electric card equipped with a non-volatile semiconductor memory device, said device comprising a cell array in which electrically rewritable and non-volatile memory cells are arranged, and a sense amplifier circuit configured to read and write data in association with said cell array, wherein said sense amplifier circuit comprises:
- a differential amplifier having first and second input nodes and configured to amplify a difference voltage between said first and second input nodes;
- a data transfer circuit configured to selectively connect said first input node to a bit line of said cell array;
- a reference voltage setting circuit configured to apply a reference voltage to said second input node of said differential amplifier; and
- a data storing circuit configured to temporarily hold a loaded write data at said first input node of said differential amplifier, and control the reference voltage at said second input node of said differential amplifier in correspondence with the write data held therein before bit line data is transferred to said differential amplifier in a data write cycle.

11. An electric device comprising:
a card interface;
a card slot connected to said card interface; and
an electric card defined in claim 10 and electrically connectable to said card slot.

12. The electric device according to claim 11, wherein said electric device is a digital still camera.

13. A non-volatile semiconductor memory device comprising a cell array in which electrically rewritable and non-volatile memory cells are arranged, and a sense amplifier circuit configured to read data in association with said cell array, wherein
said sense amplifier circuit comprises:
- a differential amplifier having first and second input nodes and configured to amplify a difference voltage between said first and second input nodes;
- a data transfer circuit configured to selectively connect said first input node to a bit line of said cell array; and
- a reference voltage setting circuit configured to apply a reference voltage, which serves for determining the bit line data transferred to said first input node, to said second input node of said differential amplifier, said reference voltage being generated based on charge-sharing between said second input node of said differential amplifier and a reference node selectively connected to said second input node, and wherein
said data transfer circuit comprises:
- a clamping transistor disposed between a bit line of said cell array and a sense node for clamping a bit line voltage and serving as a pre-sense amplifier;
- a first precharging transistor connected to said sense node for precharging said sense node and bit line;
- a transferring transistor disposed between said sense node and said first input node of said differential amplifier; and
- a second precharging transistor connected to said first input node of said differential amplifier for precharging said first input node.

14. The non-volatile semiconductor memory device according to claim 13, wherein
said reference voltage setting circuit comprises:
- a third precharging transistor connected to said second input node of said differential amplifier for precharging it at a first voltage;
- a fourth precharging transistor connected to said reference node for precharging it at a second voltage lower than said first voltage;
- a first and second capacitor connected to said second input node and said reference node for charge-storing; and
- an equalizing transistor disposed between said second input node and said reference node for selectively equalizing these nodes so as to generate the reference voltage based on charge-sharing between said third and fourth capacitors.

15. The non-volatile semiconductor memory device according to claim 13, wherein
said cell array comprises a plurality of NAND cell units each having plural memory cells connected in series, control gates of which are connected to different word lines respectively, one end of each NAND cell unit being connected to a bit line via a first select transistor, the other end connected to a source line via a second select transistor.

16. An electric card equipped with a non-volatile semiconductor memory device, said device comprising a cell array in which electrically rewritable and non-volatile memory cells are arranged, and a sense amplifier circuit configured to read data in communication with said cell array, wherein
said sense amplifier circuit comprises:
- a differential amplifier having first and second input nodes and configured to amplify a difference voltage between said first and second input nodes;
- a data transfer circuit configured to selectively connect said first input node to a bit line of said cell array; and
- a reference voltage setting circuit configured to apply a reference voltage, which serves for determining the bit line data transferred to said first input node, to said second input node of said differential amplifier, said reference voltage being generated based on charge-sharing between said second input node of said differential amplifier and a reference node selectively connected to said second input node, and wherein
said data transfer circuit comprises:
- a clamping transistor disposed between a bit line of said cell array and a sense node for clamping a bit line voltage and serving as a pre-sense amplifier;
- a first precharging transistor connected to said sense node for precharging said sense node and bit line;
- a transferring transistor disposed between said sense node and said first input node of said differential amplifier; and
- a second precharging transistor connected to said first input node of said differential amplifier for precharging said first input node.

17. An electric device comprising:
a card interface;
a card slot connected to said card interface; and
an electric card defined in claim 16 and electrically connectable to said card slot.

18. The electric device according to claim 13, wherein said electric device is a digital still camera.

* * * * *